United States Patent
Michel et al.

(10) Patent No.: US 7,385,469 B2
(45) Date of Patent: Jun. 10, 2008

(54) INTEGRATED MICROELECTRONICS COMPONENT FOR FILTERING ELECTROMAGNETIC NOISE AND RADIO FREQUENCY TRANSMISSION CIRCUIT COMPRISING SAME

(75) Inventors: Jean-Philippe Michel, Corenc (FR); Yann Lamy, Grenoble (FR); Anne-Sophie Royet, Saint Martin le Vinoux (FR); Bernard Viala, Sassenage (FR)

(73) Assignee: Commissariat a l'Energie Atomique, Paris (FR)

( * ) Notice: Subject to any disclaimer, the term of this patent is extended or adjusted under 35 U.S.C. 154(b) by 288 days.

(21) Appl. No.: 11/429,239

(22) Filed: May 8, 2006

(65) Prior Publication Data

US 2006/0290442 A1    Dec. 28, 2006

(30) Foreign Application Priority Data

May 27, 2005 (FR) .................................. 05 05346

(51) Int. Cl.
*H01P 1/215* (2006.01)
(52) U.S. Cl. ..................................... 333/219.2; 333/204
(58) Field of Classification Search ............. 333/219.2, 333/219, 204, 202, 243
See application file for complete search history.

(56) References Cited

U.S. PATENT DOCUMENTS 4,853,660 A * 8/1989 Schloemann ................. 333/204
4,980,657 A 12/1990 Stitzer et al.
5,847,628 A 12/1998 Uchikoba et al.
5,892,412 A 4/1999 Norte et al.

FOREIGN PATENT DOCUMENTS

EP         0 862 237 A1     9/1998

OTHER PUBLICATIONS

B. Viala et al., "AF-Biased CoFe Multilayer Films With FMR Frequency at 5 GHz and Beyond", IEEE Transactions on Magnetics, vol. 40, No. 4, pp. 1996-1998, Jul. 2004.
Ki Hyeon Kim et al., "Modeling for RF Noise Suppressor Using a Magnetic Film on Coplanar Transmission Line", IEEE Service Center, New York, NY, US, vol. 39, No. 5, Part 2, pp. 3031-3033, Sep. 2003.
Ki Hyeon Kim et al., "Dimensional Effects of the Magnetic Film on Coplanar Transmission Line for RF Noise Suppression", IEEE Transactions on Magnetics, vol. 40, No. 4, pp. 2847-2849 Jul. 2004.
Ki Hyeon Kim et al., "RF Integrated Noise Suppressor Using Soft Magnetic Films", IEEE Transactions on Mgnetics, vol. 40, No. 4, pp. 2838-2840, Jul. 2004.
Bijoy Kuanr et al., "Iron and Permalloy based magnetic monolithic tunable microwave devices", Journal of Applied Physics, vol. 93, No. 10, pp. 8591-8593, May 15, 2003.

* cited by examiner

*Primary Examiner*—Stephen E Jones
(74) *Attorney, Agent, or Firm*—Oliff & Berridge, PLC

(57) ABSTRACT

The integrated microelectronics component comprises an electric conductor forming a transmission line element for a radio frequency electromagnetic wave. This electric conductor is surrounded at least partially by a preferably closed magnetic circuit, formed at least by superposition of a layer of ferromagnetic material having a saturation magnetization value greater than or equal to 800 kA/m and of a layer of magnetic material. The layer of magnetic material then generates a uniaxial magnetic anisotropy in the adjacent ferromagnetic layer. A high magnetization can then be combined with a high anisotropy, thus enabling operation in high frequency ranges, for example about 5 to 20 GHz.

18 Claims, 9 Drawing Sheets

US 7,385,469 B2

INTEGRATED MICROELECTRONICS COMPONENT FOR FILTERING ELECTROMAGNETIC NOISE AND RADIO FREQUENCY TRANSMISSION CIRCUIT COMPRISING SAME

BACKGROUND OF THE INVENTION

The invention relates to an integrated microelectronics component comprising an electric conductor forming a transmission line element for a radio frequency electromagnetic wave, and means for filtering electromagnetic noise, in particular by magnetic resonance, said means for filtering electromagnetic noise comprising a layer of ferromagnetic material. It also relates to a radio frequency transmission circuit comprising such a component.

STATE OF THE ART

The article "Dimensional effects of the Magnetic Film on Coplanar Transmission Line for RF Noise Suppression", by Ki Hyeon Kim et al, IEEE Transactions on Magnetics, vol. 40, July 2004, p. 2847-2849 studies the influence of dimensioning of a film of amorphous magnetic material (CoNbZr) associated with a coplanar transmission line to constitute a RF integrated filter using the ferromagnetic resonance principle. Such a magnetic film, in the form of a magnetic strip, attenuates the harmonics of the base signal in the transmission line stopband. However attenuation does not exceed −3 dB around 6 GHz with a strip having a width of 50 µm, a length of 15 mm and a thickness of 2 µm. Increasing the global volume of the magnetic film improves the attenuation, whereas increasing the thickness thereof increases the resonance frequency. Above 200 µm, the width of the strip however no longer has any influence on attenuation and stopband mode can then no longer be controlled, frequency adjustment no longer simply depending on the actual dimensions of the strip.

It has been proposed, in the article "RF Integrated Noise Suppressor Using Soft Magnetic Films" by Ki Hyeon Kim et al, IEEE Transactions on Magnetics, Vol. 40, n°4, July 2004, p. 2838-2840, to increase the dynamics at high frequencies by a combined capacitive effect, achieved by over-dimensioning the magnetic plane with respect to the line width. The parts overlapping with the ground planes then contribute to a very great extent to the capacitive effects. It is however difficult to optimize these devices in so far as a high gyromagnetic resonance frequency requires small lateral dimensions whereas the high-frequency capacitive effect requires large dimensions.

In practice, known devices using ferromagnetic resonance do not enable frequency ranges of more than 2 GHz to be reached by the gyromagnetic effect alone. They moreover require relatively large line lengths, typically comprised between 5 and 15 mm, to achieve a sufficient absorption capacity.

The article "Iron and Permalloy based magnetic monolithic tunable microwave devices", by Bijoy Kuanr et al, Journal of Applied Physics, vol. 93, n°10, of $15^{th}$ May 2003, p. 8591-8593, describes production of filters operating at higher frequencies in the form of monolithic microwave integrated circuits (MMIC). These components use magnetron sputtering deposition of metallic ferromagnetic materials (iron or permalloy) enabling an attenuation of about 35 dB/cm to be achieved for a resonance frequency of about 15 GHz under the action of a 72 kA/m external field. These components therefore require an auxiliary magnetic field source that can not be integrated, and this solution can therefore not be applied to fully integrated systems.

OBJECT OF THE INVENTION

It is one object of the invention to provide an integrated microelectronic component not presenting these drawbacks and, more particularly, enabling operation in high frequency ranges without requiring an auxiliary magnetic field source.

According to the invention, this object is achieved by the accompanying claims and, more particularly by the fact that, the ferromagnetic material having a saturation magnetization value greater than or equal to 800 kA/m, the means for filtering electromagnetic noise are formed by a magnetic circuit surrounding the conductor and formed at least by superposition of said layer of ferromagnetic material and of a layer of magnetic material, in such a way that the layer of magnetic material generates a uniaxial magnetic anisotropy in the adjacent layer of ferromagnetic material.

It is a further object of the invention to provide a transmission circuit comprising at least one microelectronic component of this type.

BRIEF DESCRIPTION OF THE DRAWINGS

Other advantages and features will become more clearly apparent from the following description of particular embodiments of the invention given as non-restrictive examples only and represented in the accompanying drawings, in which.

DESCRIPTION OF PARTICULAR EMBODIMENTS

Figure 1:
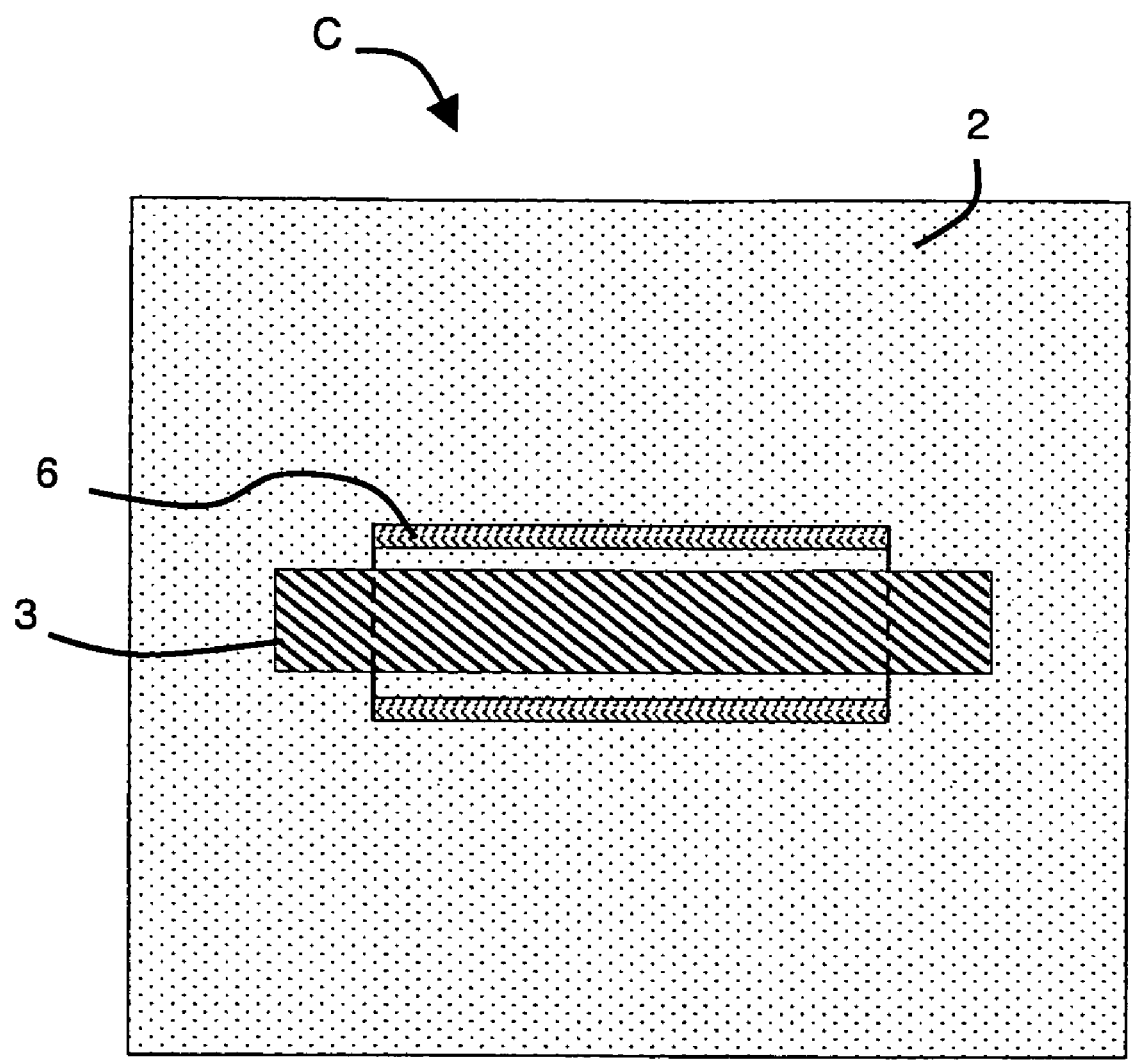
FIG. 1 represents a cross-section of a particular embodiment of a component according to the invention.
Figure 2:
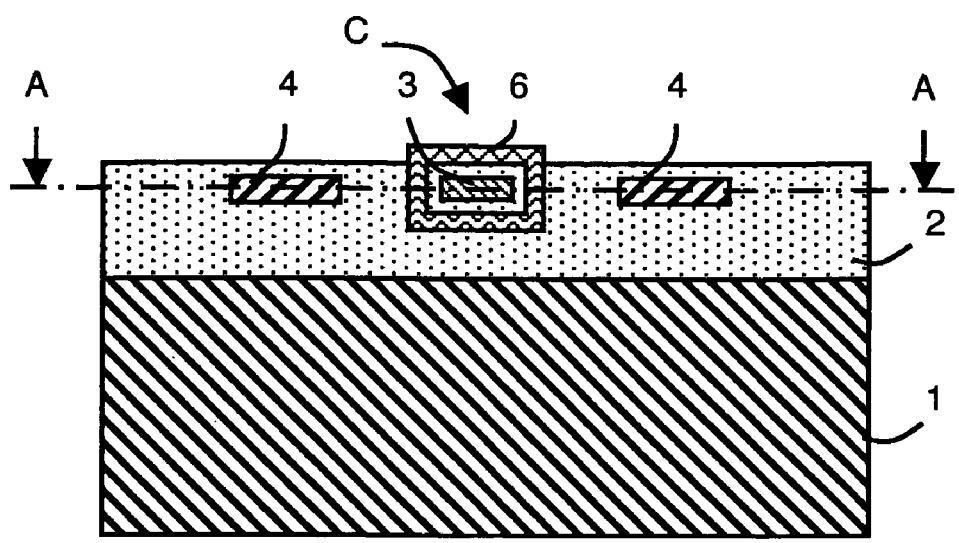
FIGS. 2 and 3 illustrate a particular embodiment of a transmission circuit comprising a component according to FIG. 1, respectively in cross-section along B-B and along A-A.
Figure 3:
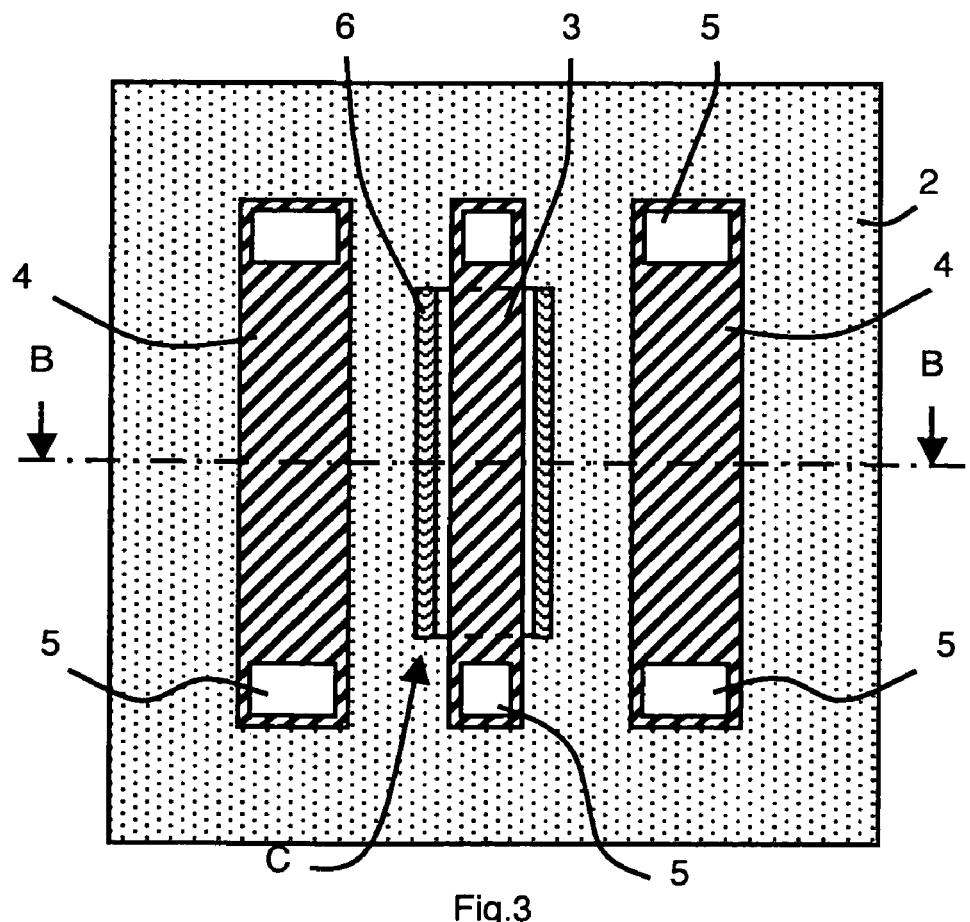

In the particular embodiments represented in FIGS. 1 to 3, the integrated microelectronic component C, of MMIC type, comprises a substrate 1 whereon a layer 2 of insulating material is deposited. A conductor 3, constituting an element of a signal transmission line, is integrated in the layer 2. In FIGS. 2 and 3, the component C is integrated in a transmission circuit comprising two coplanar ground planes 4 parallel to the conductor 3 and arranged on each side thereof. In FIG. 3, the conductor 3 comprises contact studs 5 at the ends thereof, as do the ground planes 4.

Between two contact studs 5 arranged at its ends, the conductor 3 is surrounded by a magnetic circuit 6 designed to filter the electromagnetic noise, conventionally constituted by one or more stray frequencies and associated with the wave passing through the transmission line. In the preferred embodiment, represented in FIG. 2, the magnetic circuit 6 is a closed magnetic circuit, i.e. with no air-gap, surrounding the conductor 3 totally. In an alternative embodiment (FIGS. 13 and 14), the magnetic circuit 6 can comprise one or more air-gaps. It does however surround the conductor 3 practically totally.

In all cases, the walls of the magnetic circuit 6 are formed by superposition of at least two layers, i.e. a layer 7 of ferromagnetic material f and a layer 8 of magnetic material m. The order of the layers 7 and 8 with respect to the electric conductor 3 is of no importance.

Figure 4:
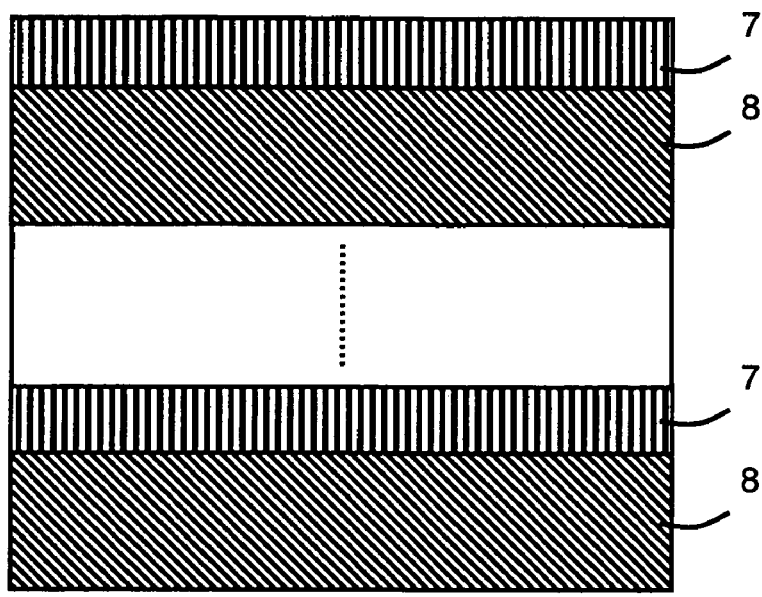
FIGS. 4 and 5 represent cross-sections of two alternative embodiments of the wall of the magnetic circuit of a component according to the invention.
Figure 5:
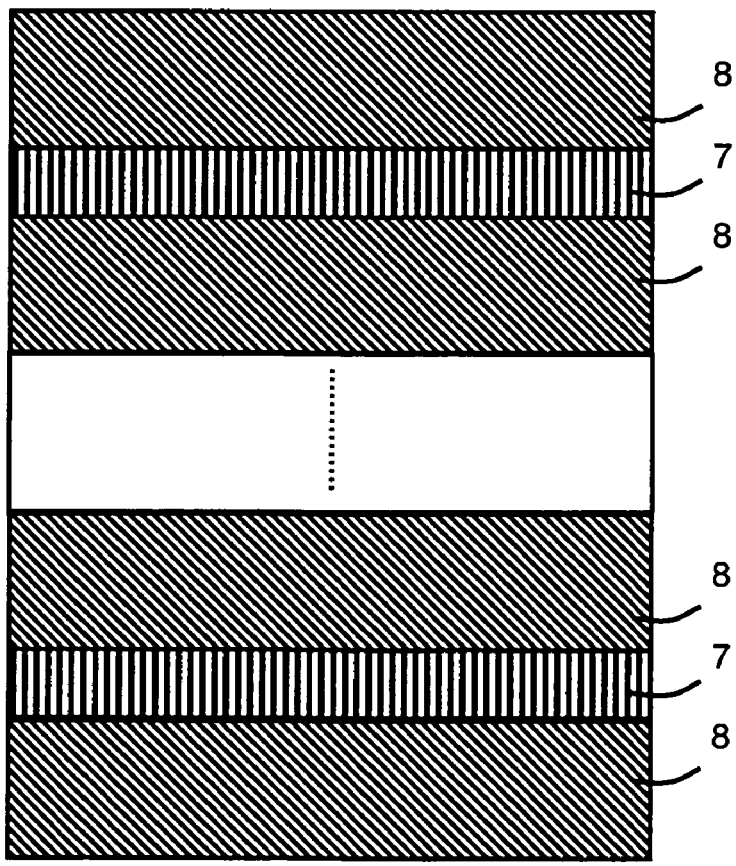

As represented in the alternative embodiments of FIGS. 4 and 5, the magnetic circuit 6 can be formed by alternating a plurality of layers 7 of ferromagnetic material f and layers 8 of magnetic material m. In a more general manner, the walls of the magnetic circuit 6 can thus, from the outside, be formed by superposition of layers (f/m)n as represented in FIG. 4, (m/f)n or (m/f/m)n as represented in FIG. 5, n being an integer greater than or equal to 1.

Associating a layer 8 of magnetic material m and a layer 7 of ferromagnetic material f generates a uniaxial magnetic anisotropy in the adjacent layer of ferromagnetic material f or increases its natural anisotropy, for example by exchange coupling effect at the interface in the case where m is an antiferromagnetic layer.

This phenomenon has been mentioned in the article "AF-Biased CoFe Multilayer Films with FMR Frequency at 5 GHz and Beyond" by B. Viala et al., IEEE Transactions on Magnetics, vol. 40, n°4, July 2004, p. 1996-1998, which studies the properties of a thin layer of ferromagnetic material (CoFe), that is not naturally soft, between two thin layers of antiferromagnetic material, in the context of studies relating to increasing the magnetic resonance frequency of inductors used in RF circuits.

Figure 11:
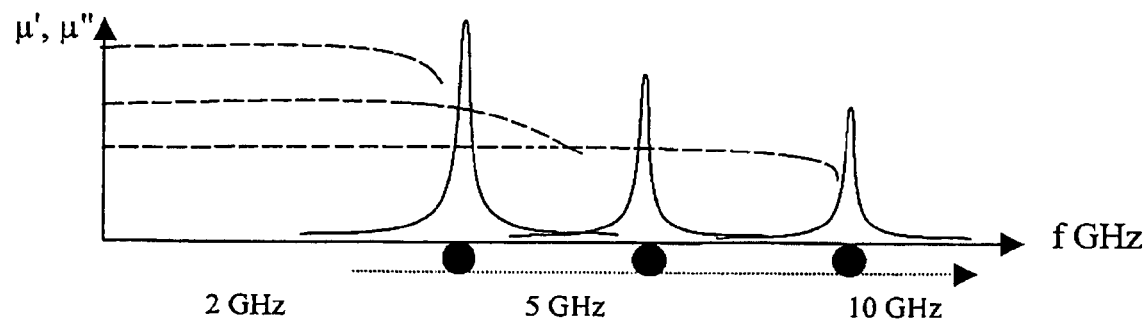
FIGS. 11 and 12 illustrate the choice of the operating point on a diagram representing, in unbroken line, the variations of the magnetic losses µ" and, in broken line, the variations of the permeability µ' versus the frequency f for various applications.
Figure 12:
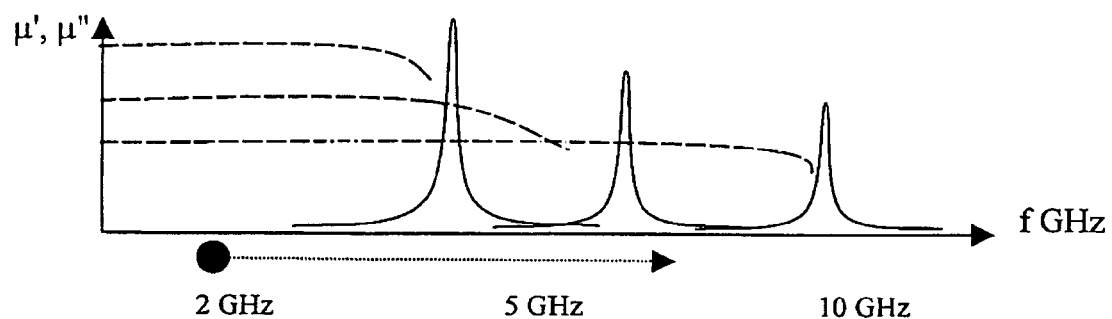

The preferably closed magnetic circuit 6 surrounding the electric conductor 3 acting as RF transmission line or as RF transmission line element thus forms a magnetic microresonator based on the gyromagnetic resonance effect (in the operating mode illustrated in FIG. 11) or on the wavelength reduction effect (in the operating mode illustrated in FIG. 12). The electromagnetic field generated by the transmission line is confined to the maximum inside the microresonator.

The conventional homogeneous anisotropic soft ferromagnetic materials and alloys conventionally used in microelectronics, in particular to form ferromagnetic inductors, only enable applications at relatively low frequency (up to 1 GHz). Indeed, these materials only offer intrinsic resonance frequencies of about 1 GHz maximum. On the other hand, associating a ferromagnetic material layer f and an antiferromagnetic material layer m allows the combination of a high uniaxial anisotropy Hk, for example greater than or equal to 40 kA/m (or Hk≧500 Oe in C.G.S. units as 1 Oe=(1000/4π) A/m), with a very strong saturation magnetization Ms≧800 kA/m (i.e. 4πMs≧10 kOe), and preferably about the maximum value of 1920 kA/m (i.e. 4πMs=24 kOe), which enables intrinsic resonance frequencies greater than or equal to 10 GHz to be obtained.

The two layers 7 and 8 have quite separate functions. Thus, the layer 7, made of ferromagnetic material f, first of all has the function of ensuring as high a saturation magnetization as possible. The ferromagnetic material does not need to be soft and is preferably formed by cobalt and iron alloys CoFe, which present the strongest magnetizations known at the present time. However, these materials had up to now been discarded for RF applications as they are not naturally soft. They do in fact have a too high coercive field Hc, of about 3 kA/m (i.e. 40 Oe), whereas conventional soft materials, such as permalloy for example, are characterized by values typically lower than or equal to around 80 A/m (1 Oe). Iron and cobalt alloys, which do not have a uniaxial magnetic anisotropy either, whether it be natural or induced by conventional deposition processes under a magnetic field, therefore do not initially present the required dynamic properties for generating a ferro-magnetic resonance effect.

The ferromagnetic material forming the layer 7 is preferably chosen from iron, cobalt, and iron- and/or cobalt-base alloys. It is advantageously formed by an iron-and-cobalt base alloy such as $Fe_{65}Co_{35}$, $Co_{50}Fe_{50}$ and $Co_{90}Fe_{10}$. At present, the $Fe_{65}Co_{35}$ alloy offers the highest saturation magnetization Ms, about 1920 kA/m (i.e. 4πMs=24 kOe)

In a particular embodiment, the ferromagnetic material layer 7 is made electrically insulating by mixing the above-mentioned alloys with a small quantity, advantageously less than 1% in weight, of a dielectric material, for example alumina ($Al_2O_3$). The material is then preferably in granular form.

The layer 8 of magnetic material m has the function of ensuring the anisotropy of the layer 7 of ferromagnetic material. In a preferred embodiment, the magnetic material is an antiferromagnetic material. The antiferromagnetic materials used are preferably alloys having a base of manganese (Mn) and an element chosen from nickel (Ni), iron (Fe), platinum (Pt) and iridium (Ir). They can advantageously be achieved from nickel and/or iron and/or cobalt oxides.

The layer 8 of magnetic material m can also be made of hard magnetic material of permanent magnet type. For example, the material of this layer can then be chosen from the iron/samarium (Fe/Sm), cobalt/samarium (Co/Sm), cobalt/platinum (Co/Pt), cobalt/chromium (Co/Cr) and iron/neodymium/boron (FeNdB) alloys.

The magnetic and ferromagnetic layers are advantageously formed by sputtering, for example by cathode sputtering, evaporation or ion sputtering.

Figure 6:
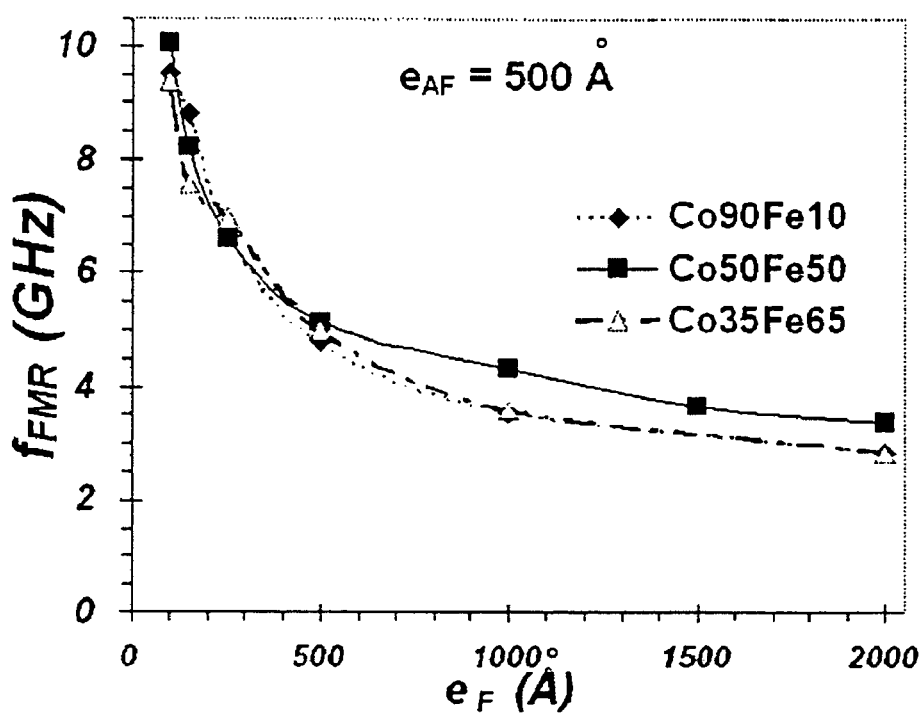
FIGS. 6 and 7 illustrate the variation of the ferromagnetic resonance frequency $f_{FMR}$ versus respective thicknesses of the ferromagnetic and magnetic layers forming the wall of the magnetic circuit of a component according to the invention.
Figure 7:
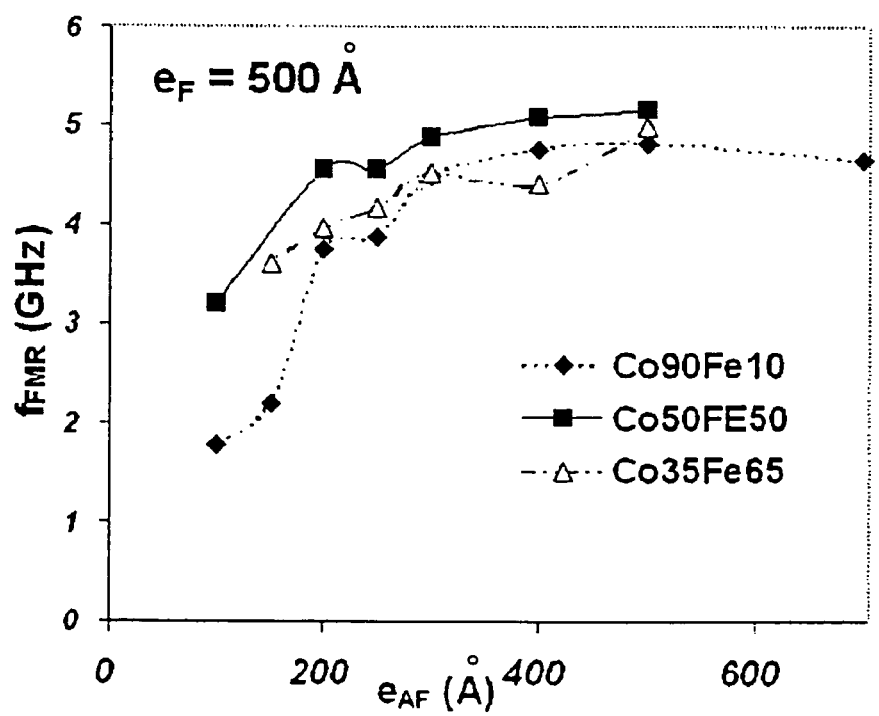

FIGS. 6 and 7 illustrate the variation of the ferromagnetic resonance frequency $f_{FMR}$ versus respective thicknesses of the layers 7 of ferromagnetic material and the layers 8 of magnetic material for a closed magnetic circuit 6 comprising a layer 7 of CoFe (respectively of $Fe_{65}Co_{35}$, $Co_{50}Fe_{50}$ and $Co_{90}Fe_{10}$) between two layers 8 of NiMn. In FIG. 6, the thickness $e_{AF}$ of the layers 8 of antiferromagnetic material is kept constant, at 500 Å. The ferromagnetic resonance frequency then varies from 3 GHz to 10 Ghz, when the thickness $e_F$ of the thin layer 7 of ferromagnetic material goes from 2000 Å to 100 Å. In FIG. 7, the thickness $e_F$ of the layer 7 of ferromagnetic material is kept constant, at 500 Å. The ferromagnetic resonance frequency, initially comprised between 1.8 and 3.5 GHz (depending on the particular CoFe alloy chosen), increases up to about 5 Ghz when the thickness $e_{AF}$ of the antiferromagnetic material layer 8 goes from 100 Å to 600 Å.

Taking these variations into account, the respective thicknesses of the layers of magnetic material and ferromagnetic material can be chosen according to the intended applications so as to adapt the frequencies by adjusting the thicknesses of the layers 7 and 8. The different layers 7 and 8 can all have the same thickness or different thicknesses.

Figure 8:
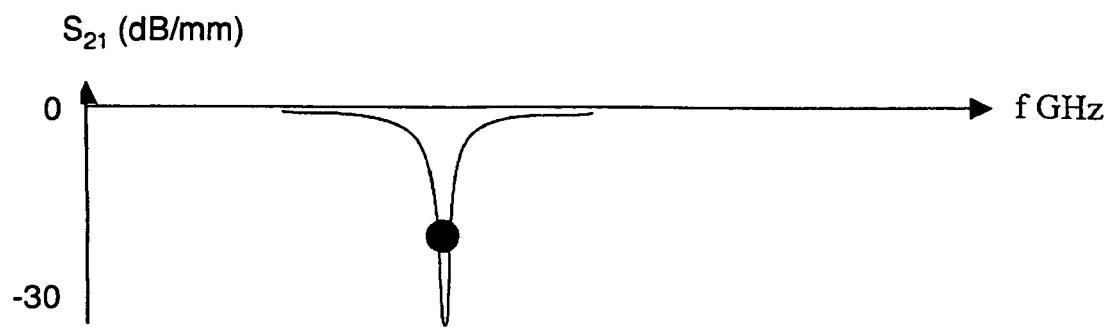
FIGS. 8 to 10 illustrate the choice of the operating point on a diagram representing the variations of the attenuation $S_{21}$ versus the frequency f for various applications.
Figure 9:
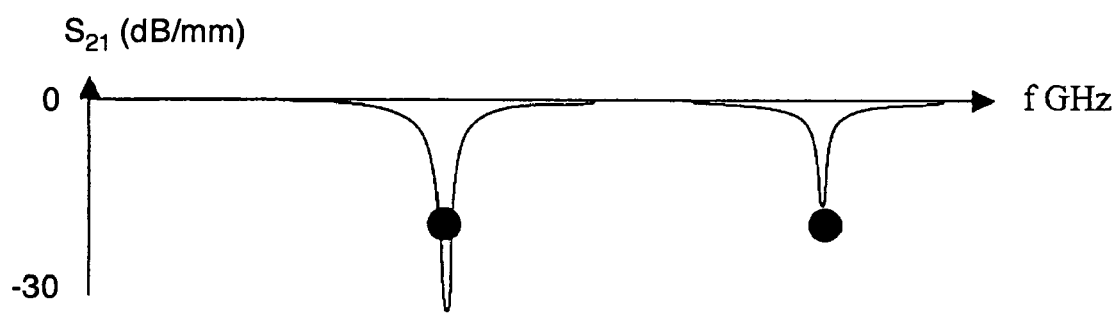
Figure 10:
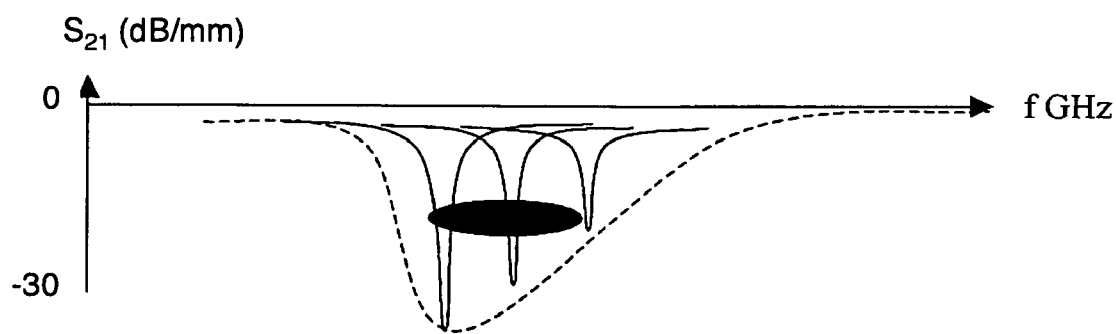

FIGS. 8 to 10 illustrate the choice of the operating point (represented by a black dot) on a diagram representing the variations of the attenuation $S_{21}$ versus the frequency f for various applications. For example, in FIG. 8, the respective thicknesses of the layers 7 and 8 are chosen such that a single resonance peak is centred on a frequency to be filtered, to perform a single bandstop filtering function. In FIG. 9, the respective thicknesses of the layers 7 and 8 are chosen in such a way that the separate resonance peaks, with no overlapping, are respectively centred on different frequencies to be filtered to perform a multiple bandstop filtering function or a bandpass function. The choice of two or three suitable thicknesses notably enables two or three separate resonance peaks to be defined for double or triple bandstop filtering functions.

These different types of filtering functions can be used in particular in:
  frequency mixers wherein it is sought to clean the spectral band from at least one stray frequency associated with the natural frequency of a local oscillator,
  transmission circuits wherein it is sought to eliminate at least one base signal harmonic,
  multi-channel transmission systems the inter-channel insulation whereof is sought to be improved,
  oscillators the spectral purity whereof is sought to be improved . . . .

FIG. 10 illustrates the combination of multiple resonance peaks with overlapping to perform filtering functions designed to eliminate signal transmission in the upper spectral band, in particular for low-pass filters and noise suppressor filters.

FIGS. 11 and 12 illustrate the choice of the operating point on a diagram representing the variations of the magnetic losses $\mu''$ versus the frequency f, in an unbroken line, with three separate resonance peaks each corresponding to a different permeability $\mu'$, represented in a broken line.

As represented in FIG. 11, the component, in which the electric conductor 3 constitutes a RF transmission line element or a RF transmission line, can be used in its absorption band, with an operating point centred on the magnetic resonance frequency. It can also, as represented in FIG. 12, be used before its absorption band to increase the inductance and quality factor of the line and/or to reduce the length of the line by decreasing the signal wavelength. Such a transmission line element can then be used in a transmission line for microwave applications. This in particular enables the performances and compactness of existing circuits (RLC filters, half-wave and quarter-wave lines . . . ) to be improved and new functionalities to be created.

Moreover, associating layers 7 and 8 enables the coherent rotation of the magnetization at 90° from the trapping direction resulting from the exchange coupling to be used for dynamic purposes. Magnetization of the ferromagnetic material layer 7 is kept in a quasi-saturated state due to the strong trapping due to the exchange coupling. The layers are therefore naturally of the mono-domain type and the problems conventionally connected with distribution of the magnetization in domains can therefore be overcome. The theoretical dissipative behaviour is then quasi-optimal, rotation of the magnetization 90° from the trapping direction being very close to the ideal theoretical case in which distribution of the moment is homogeneous and the layers are domain-free.

The different layers 7 of ferromagnetic material can have identical or opposite trapping directions according to the intended applications. These trapping directions can also be oriented identically or differently, depending on requirements.

Frequency adjustments can thus be made by adjusting the thicknesses of the different layers of magnetic and/or ferromagnetic material independently, and/or by adjusting the trapping directions and/or angular orientations of the layers in their plane. A frequency tunability typically ranging from 5 to 20 GHz can in particular be obtained by simply adjusting the respective thicknesses of the layers 7 and 8.

Figure 13:
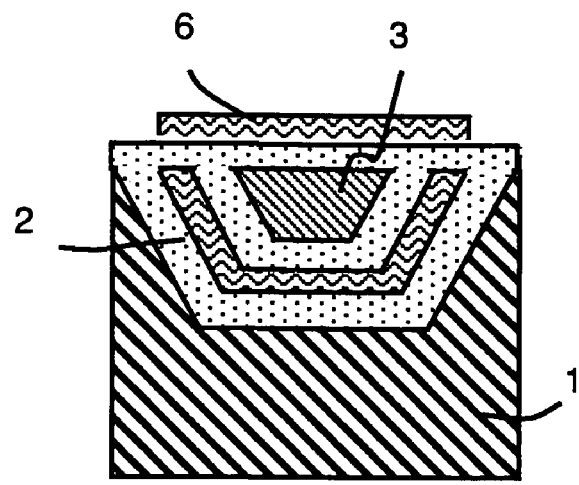
FIGS. 13 to 15 illustrate three alternative embodiments of a component according to the invention.
Figure 14:
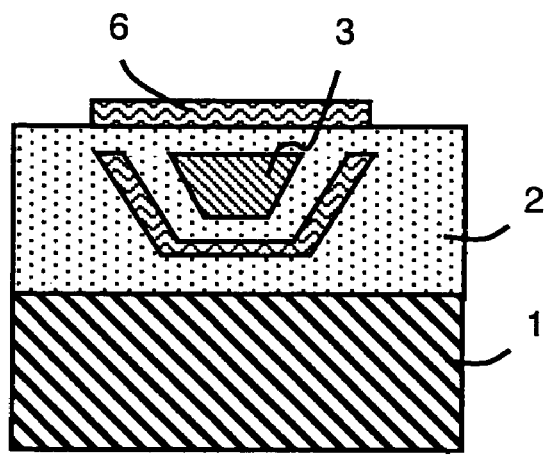
Figure 15:
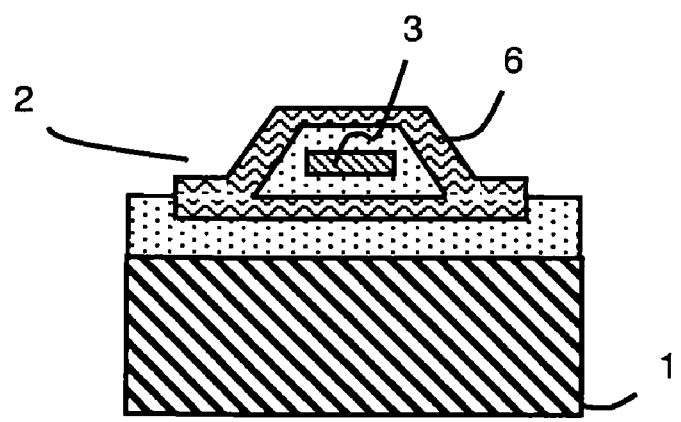

The component can be fabricated by standard fabrication methods used in microelectronics. FIGS. 13 to 15 illustrate, in cross-section, three possible alternative embodiments for producing the magnetic circuit 6 surrounding the electric conductor 3.

In the alternative embodiment of FIG. 13, a cavity is formed in the substrate 1. This cavity comprises a flat bottom and two inclined flat side walls widening upwards in the cavity. If the cavity is formed by anisotropic etching (KOH) in a substrate 1, made of Si<100> silicon for example, the inclined side walls of the cavity make an angle of 54.7° with the horizontal. The bottom and walls of the cavity are covered by the insulating material 2. A bottom part of the magnetic circuit 6 is then formed by successive deposition of the different layers 7 and 8 constituting said circuit on the bottom and walls of the cavity. After a fresh deposition of insulating material 2, the electric conductor 3 is formed inside the cavity by deposition of the conductor, followed by planarization. A layer of insulating material 2, the thickness whereof controls the thickness of the air-gap of the magnetic circuit 6, is then deposited flat on the cavity. Then a flat wall forming the top part of the magnetic circuit 6 is formed by deposition of the different layers 7 and 8 above this last layer of insulator. As represented in FIG. 13, the magnetic circuit 6, surrounding almost the whole of the conductor 3, thus comprises two air-gaps between its bottom and top parts.

In the alternative embodiment of FIG. 14, a cavity is formed in a layer of insulating material 2 covering the substrate 1. As in FIG. 13, this cavity comprises a flat bottom and two upwardly-widening inclined side walls. It is formed in the insulating material 2 by etching from a lithographed photoresist (for example PFRIX420 19 Cp) presenting flanks at the pattern edge making an angle comprised between 10° and 45° with the horizontal. This angle can be adjusted for example using a proximity exposure technique with a controlled distance between the mask and photoresist. This controlled distance is typically comprised between 10 and 100 μm. Another possible technique consists in using phase contrast masks. As in FIG. 13, the bottom part of the magnetic circuit 6 is then formed by successive deposition of the different layers 7 and 8 constituting same on the bottom and walls of the cavity. After a fresh deposition of insulating material 2, the electric conductor 3 is formed inside the cavity by deposition of the conductor, followed by planarization. A layer of insulating material 2, the thickness whereof controls the thickness of the air-gap of the magnetic circuit 6, is then deposited flat on the cavity. Then a flat wall forming the top part of the magnetic circuit 6 is formed by deposition of the different layers 7 and 8 above this last layer of insulator.

In the alternative embodiment of FIG. 15, the bottom part of the magnetic circuit 6 is formed by a flat wall formed on a layer 2 of insulating material by successive deposition of the different layers 7 and 8. After deposition of a new layer of insulating material 2 and planarization, the electric conductor 3 is formed inside a well made in the insulating material. It is then covered by the insulating material. The insulating material is then etched, up to the bottom part of the magnetic circuit 6, with a trapezoid shape, delineated by a flat top wall and by two upwardly-narrowing inclined side walls. As in the embodiment of FIG. 14, the trapezoid is formed in the insulating material 2 by etching from a lithographed photoresist (for example PFRIX420 19 Cp) presenting flanks at the pattern edge making an angle comprised between 10° and 45° with the horizontal. This angle can be adjusted for example using a proximity exposure technique with a controlled distance, typically comprised between 10 and 100 µm, between the mask and photoresist, or by using phase contrast masks. The top part of the magnetic circuit is then formed by successive deposition of the different layers 7 and 8 constituting same on the flat top wall and on the inclined side walls of the trapezoid. The top part of the circuit 6 is in contact with the bottom part thereof, thus forming a closed magnetic circuit 6.

The alternative embodiments of FIGS. 14 and 15 are advantageous compared with the alternative embodiment of FIG. 13 as they enable the angles formed by the inclined side walls and the horizontal to be reduced to values comprised between 10° and 45°. This guarantees the dynamic performances (high permeability) of the magnetic material deposited on these inclined side walls.

The alternative embodiment according to FIG. 15 is all the more advantageous as it is the only one enabling a closed magnetic circuit 6 to be achieved, with an optimal bottom part as far as the slope of the inclined walls is concerned and an optimal top part formed by a flat wall. A top part formed by a flat wall is not however able to be achieved with the production methods used in the alternative embodiments of FIGS. 13 and 14 if a closed magnetic circuit is required.

In another alternative embodiment, the side parts of the magnetic circuit 6 of the component of FIG. 15 can be omitted, thus forming (as in FIGS. 13 and 14) a magnetic circuit with two air-gaps.

The component according to the invention thus forms a magnetic microresonator able to be used indifferently in coplanar, microstrip or tri-wafer topology. Fabrication of such a component is compatible with microelectronics techniques and with different types of substrates (Si, SOI, ceramic, PCB, Kapton® . . . ).

For example, in the filtering field, the component according to the invention, in coplanar topology, enables the central frequency of a filter to be adjusted from 2 to 20 GHz, with a maximum attenuation of −30 dB/mm and insertion losses of less than −3 dB/mm.

For example, a component C according to FIG. 1 can comprise:
- an electric conductor 3 and ground planes 4 with a width of 5 to 150 µm, a length of 100 to 1000 µm and a thickness of 0.5 to 5 µm,
- an insulator 2, formed by a benzocyclobutene-base resin (BCB), with a thickness of less than 1 µm between the electric conductor 3 and the closed magnetic circuit 6,
- a stack of layers 7 and 8 (f/m)n as represented in FIG. 4, with n comprised between 1 and 100, in which the layers 7 of FeCo alloy each have a thickness comprised between 0.01 and 0.5 µm and the layers 8 of NiMn alloy each have a thickness comprised between 0.01 and 0.05 µm, or
- a stack of layers 7 and 8 (m/f/m)n according to FIG. 5, with a thickness of from 0.1 to 1 µm.

Figure 16:
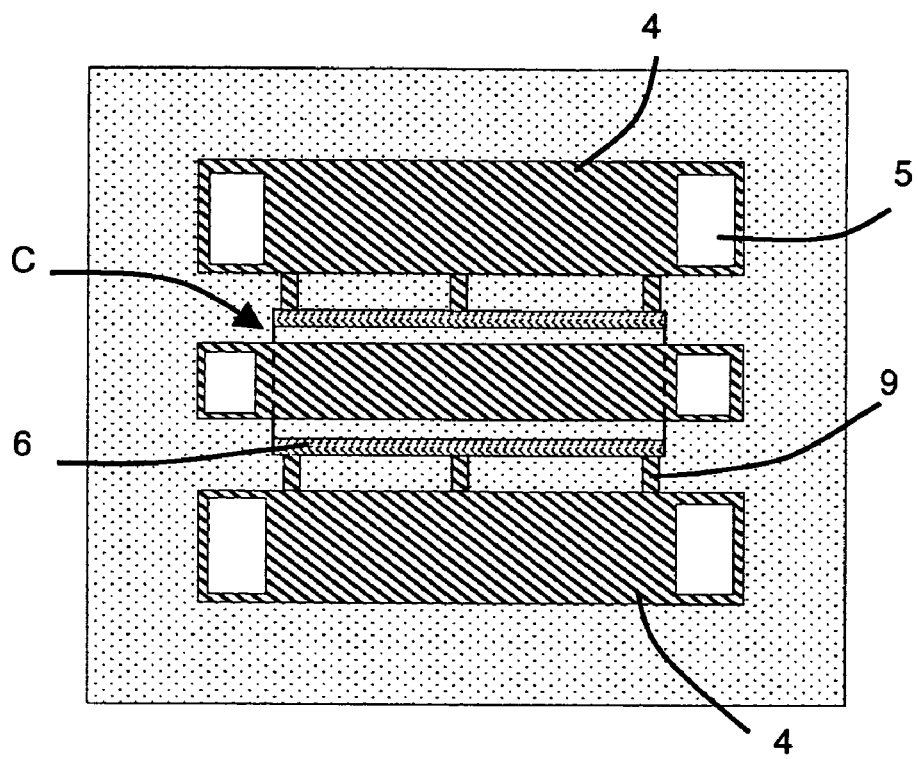
FIGS. 16 to 19 represent various transmission circuits using at least one component according to the invention.
Figure 17:
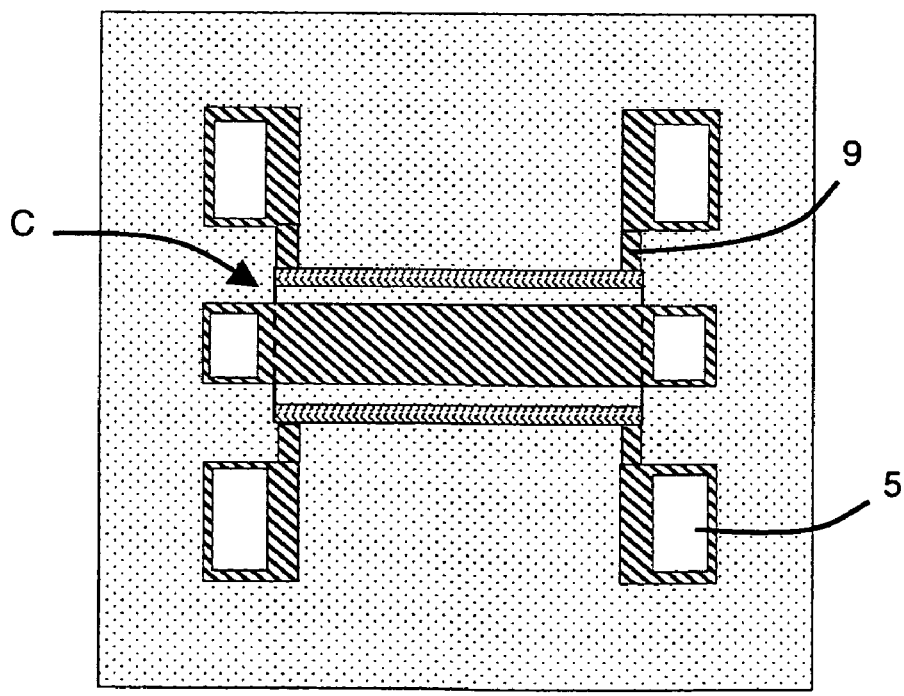
Figure 18:
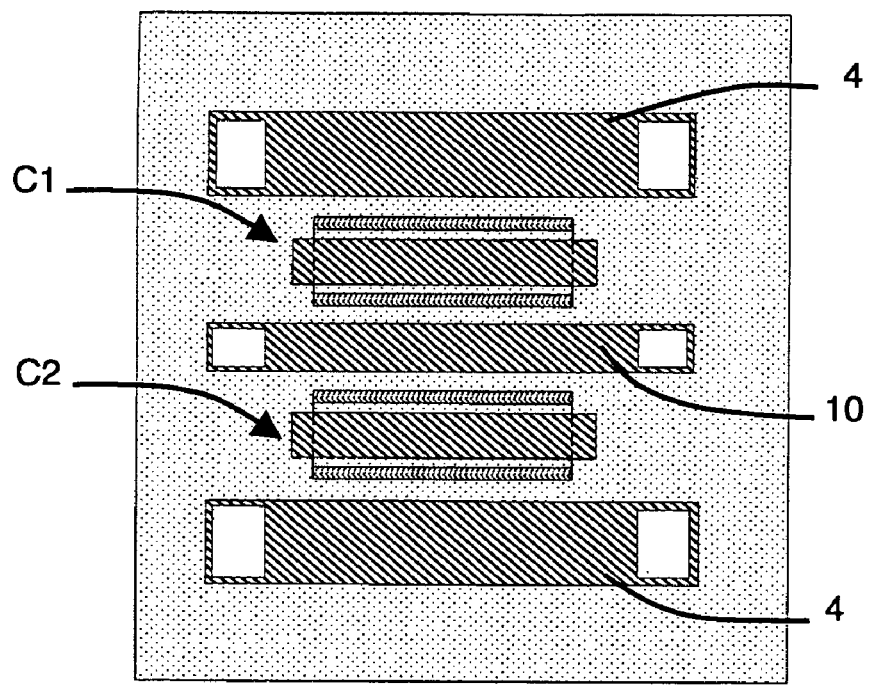

FIGS. 16 to 18 illustrate various embodiments of a radio frequency transmission circuit using at least one component C.

The transmission circuit according to FIG. 16 differs from the transmission circuit according to FIG. 3 by the fact that the magnetic circuit 6 of the component C is grounded, for example by means of transverse electric connections 9 connecting the magnetic circuit 6 to the ground planes 4 arranged on each side of the component C. This enables the absorption capacity of the circuit to be increased. In the alternative embodiment illustrated in FIG. 16, three transverse electric connections 9 are associated with each ground plane. Two of these end connections 9 connect the ends of the magnetic circuit 6 to the ends of the associated ground plane, whereas a central third connection 9 is arranged between the other two.

The circuit according to FIG. 17 differs from the circuit according to FIG. 16 by suppression of the part of the ground planes 4 that is arranged between the two end electric connections 9.

In the circuits according to FIGS. 16 and 17, as in FIG. 3, the conductor 3 of the component C belongs to a central transmission line arranged between two lateral ground planes 4.

Figure 19:
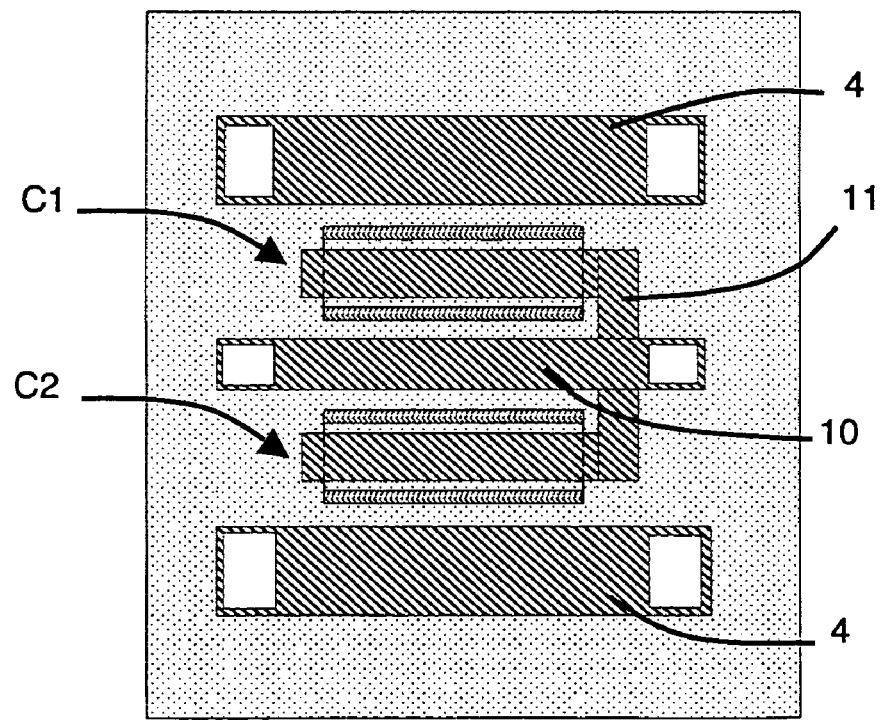

A transmission circuit can comprise several components C. The circuits according to FIGS. 18 and 19, for example, differ from the circuit according to FIG. 3 by the fact that they comprise two components (C1, C2), respectively arranged between a central transmission line (10) and the lateral ground planes (4). In FIG. 18, there is no electric connection between the central transmission line (10) and the conductors 3 of the components C1 and C2, whereas in FIG. 19, the electric conductors 3 of the components C1 and C2 are electrically connected to the central transmission line by connections 11 at the level of their ends. Several components C1 (or C2) can also be arranged, for example side by side or one above the other, between the central transmission line 10 and one of the ground planes 4.

The invention claimed is:

1. Integrated microelectronics component comprising at least one electric conductor, forming a transmission line element for a radio frequency electromagnetic wave, and filtering means for filtering electromagnetic noise, wherein said means for filtering electromagnetic noise are formed by a magnetic circuit surrounding the conductor and formed at least by superposition of a layer of ferromagnetic material having a saturation magnetization value greater than or equal to 800 kA/m and of a layer of magnetic material, in such a way that the layer of magnetic material generates a uniaxial magnetic anisotropy in the adjacent layer of ferromagnetic material.

2. Component according to claim 1, wherein the magnetic circuit surrounding the conductor is a closed magnetic circuit.

3. Component according to claim 1, wherein the magnetic circuit surrounding the conductor comprises at least one air-gap.

4. Component according to claim 1, wherein the ferromagnetic material has a saturation magnetization value of about 1920 kA/m.

5. Component according to claim 1, wherein the magnetic circuit is formed by alternation of a plurality of layers made of ferromagnetic material and layers made of magnetic material.

6. Component according to claim 1, wherein the respective thicknesses of the layers of magnetic material and ferromagnetic material are chosen such that a single resonance peak is centred on a frequency to be filtered.

7. Component according to claim 1, wherein the thicknesses of the layers of magnetic material and ferromagnetic material are chosen such that separate resonance peaks are respectively centred on different frequencies to be filtered.

8. Component according to claim 1, wherein the magnetic circuit is grounded.

9. Component according to claim 1, wherein the magnetic material is a hard magnetic material.

10. Component according to claim 9, wherein the magnetic material is chosen from iron/samarium, cobalt/samarium, cobalt/platinum, cobalt/chromium and iron/neodymium/boron alloys.

11. Component according to claim 1, wherein the ferromagnetic material is chosen from iron, cobalt, and iron- and/or cobalt-base alloys.

12. Component according to claim 11, wherein the ferromagnetic material is chosen from $Fe_{65}Co_{35}$, $Co_{50}Fe_{50}$ and $Co_{90}Fe_{10}$.

13. Component according to claim 1, wherein the magnetic material is an antiferromagnetic material.

14. Component according to claim 13, wherein the antiferromagnetic material is chosen from manganese-base alloys and an element chosen from nickel, iron, platinum and iridium.

15. Component according to claim 13, wherein the antiferromagnetic material is made from nickel and/or iron and/or cobalt oxides.

16. Transmission circuit comprising at least one central transmission line and two lateral ground planes, comprising at least one component according to claim 1.

17. Circuit according to claim 16, wherein the conductor of the component belongs to the central transmission line.

18. Circuit according to claim 16, comprising at least two components respectively arranged between the central transmission line and the lateral ground planes.

* * * * *